July 24, 1962 J. P. PHILBIN ETAL 3,045,820

FEEDING AND GAGING APPARATUS

Filed Feb. 24, 1960 4 Sheets-Sheet 1

INVENTORS.
JAMES P. PHILBIN
BY WILLIAM B. FINNEGAN
Pennie Edmonds Morton Barrows & Taylor
ATTORNEYS

INVENTORS.
JAMES P. PHILBIN
WILLIAM B. FINNEGAN
BY
ATTORNEYS

INVENTORS.
JAMES P. PHILBIN
WILLIAM B. FINNEGAN
BY
Pennie Edmonds Morton Barrows & Taylor
ATTORNEYS

FEEDING AND GAGING APPARATUS

Filed Feb. 24, 1960 4 Sheets-Sheet 4

INVENTORS
JAMES P. PHILBIN
WILLIAM B. FINNEGAN
BY
ATTORNEYS 3,045,820
FEEDING AND GAGING APPARATUS
James P. Philbin, East Northport, and William B. Finnegan, Wantagh, N.Y., assignors to Cutler-Hammer, Inc., Milwaukee, Wis., a corporation of Delaware
Filed Feb. 24, 1960, Ser. No. 10,684
14 Claims. (Cl. 209—82)

This invention relates to apparatus for feeding and gaging very small parts, particularly thin wafers of small area.

In the manufacture of transistors tiny wafers of semiconductor material are used. These are commonly sliced from a bar of material, etched, etc., and vary somewhat in thickness. In order to standardize characteristics, it is important to use crystal wafers whose thickness lies within very close tolerances for a given type of transistor. As an example, the wafers may be about 0.04 inch square and 0.0015 inch thick, and it may be required to employ wafers for any one type of transistor which do not vary be more than, say, 50-millionths of an inch from a specified value.

Manual gaging of crystals is expensive. Automatic gaging is difficult, not only because of the size of the crystals and the precision required, but also because of their fragile nature and the high gaging and sorting rate desired.

The present invention is directed to the provision of apparatus capable of feeding, gaging and segregating wafers within close tolerances and at a high speed, say several thousand an hour, while at the same time handling the wafers sufficiently carefully to avoid excessive breakage.

In accordance with the invention a supply of crystal wafers is placed in a vibratory feeder having a trough which delivers the wafers in succession to a head section. Means are provided for detecting a wafer at a point along its line of travel at the head section, whereupon suction is applied to apertures which prevent further travel of wafers until the detected wafer is in the process of being gaged and sorted.

The detected crystal wafer is delivered to a gage feeding unit including a platform and intermittent moving means for moving the wafer to a gaging point. Advantageously the moving means is an intermittently rotatable transfer mask having apertures which receive the detected wafers and deliver them successively to a gaging position. Suction is advantageously applied through apertures at the receiving area of the gaging platform and along the path to the gaging position, so as to hold the wafers on the platform and also to remove any dust, crystal particles, etc. which might otherwise accumulate and impair gaging accuracy. When a wafer reaches the gaging position, it is held by suction and its thickness gaged by suitable gaging equipment which classifies the wafers into appropriate thickness ranges and actuates a segregator. When the wafer has been gaged, it is delivered to the segregator. Advantageously this is accomplished by further rotation of the corresponding aperture in the transfer mask to a discharge position.

The specific embodiment described hereinafter includes a number of features which promote the careful handling of waters and insure their precise gaging, one at a time, and ultimate segregation. These features will in part be pointed out hereinafter and in part be obvious from the description.

Although the specific embodiment has been particularly designed for gaging wafers of semiconductor material wherein careful handling is especially important, the invention may also be applied to the gaging of other kinds of small parts, with suitable modifications if necessary.

Figure 1:
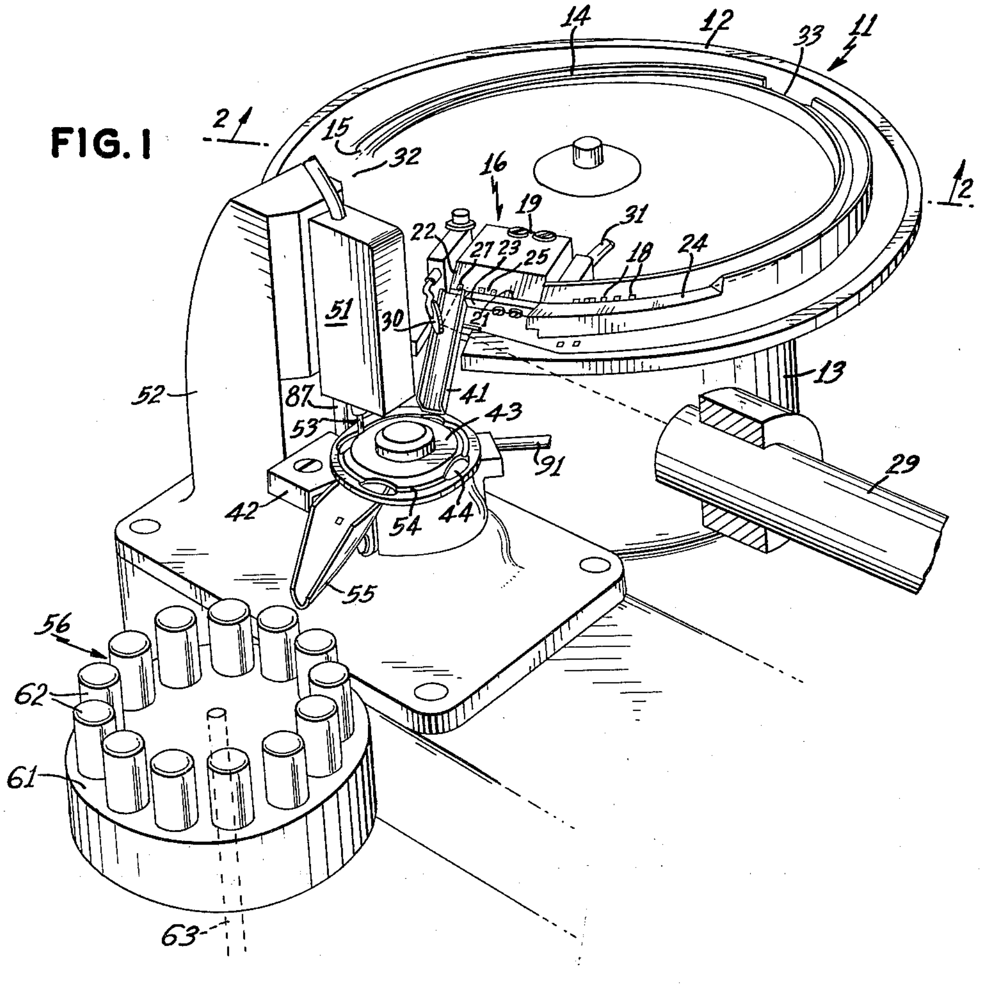
FIG. 1 is a perspective view of the mechanical portion of the apparatus of the invention.
Figures 3, 4, 5, 6:
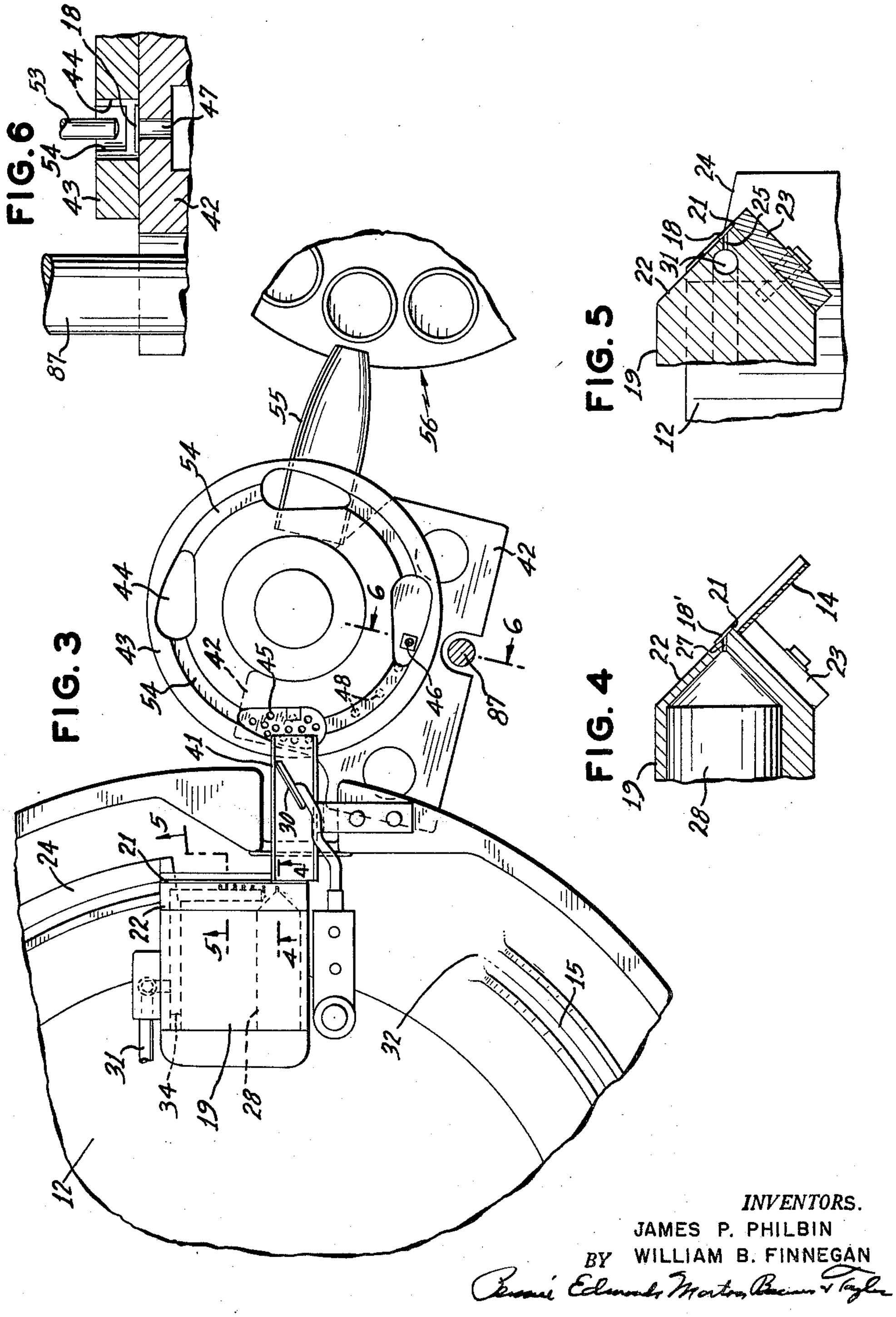
FIG. 3 is a plan view of a portion of the apparatus of FIG. 1.
Figure 7:
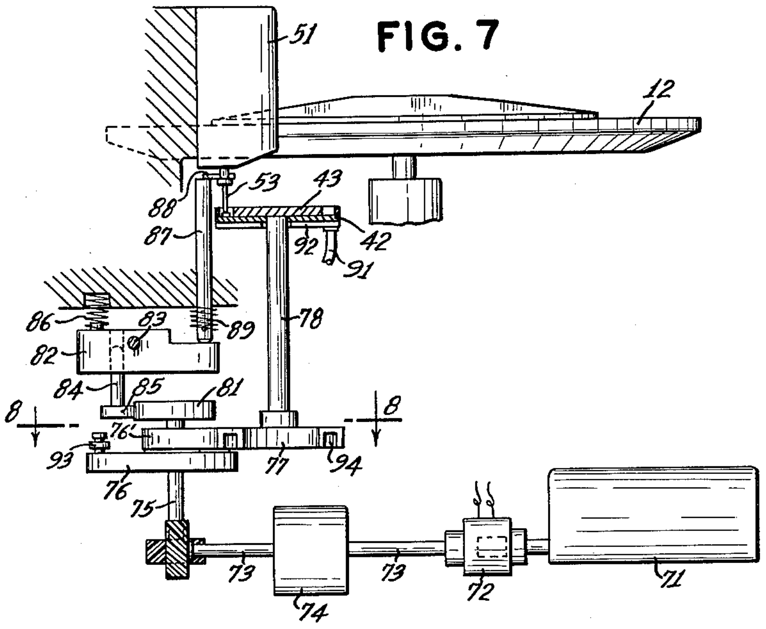
Figure 8:
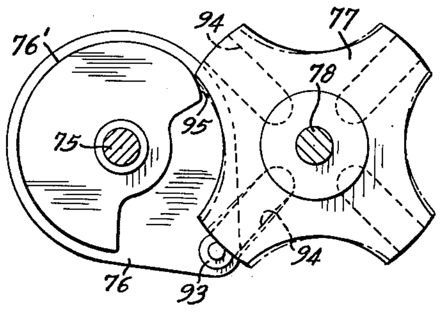
Figure 9:
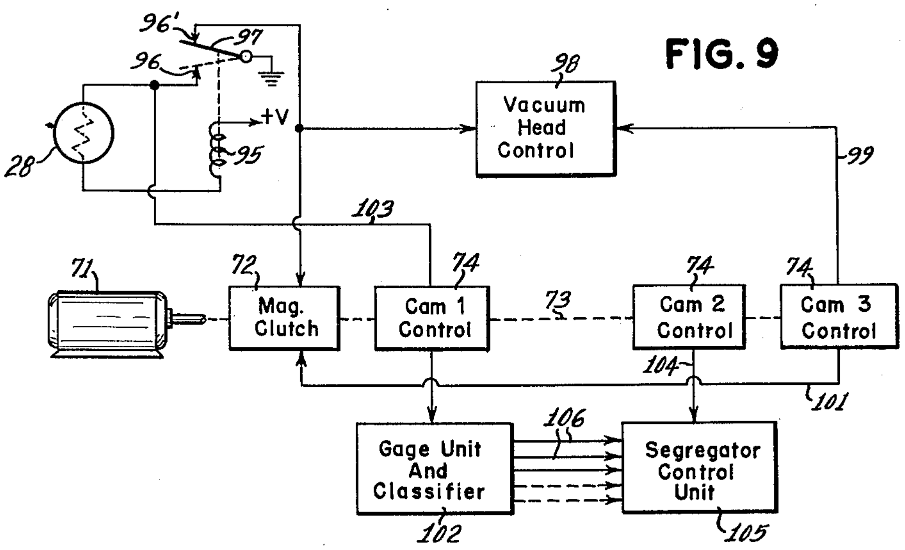
Figure 10:
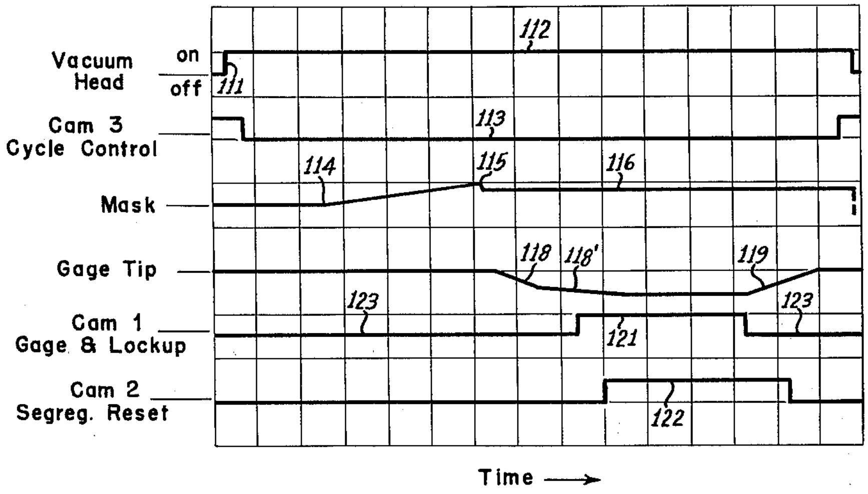

FIGS. 4, 5 and 6 are details taken along the lines 4—4, 5—5 and 6—6 of FIG. 3, respectively;

FIG. 7 is a schematic showing the driving arrangement for the apparatus of FIG. 1;

FIG. 8 is a detail showing the Geneva movement of FIG. 7;

FIG. 9 is a block diagram illustrating a suitable control circuit for the apparatus of FIG. 1; and FIG. 10 is a timing diagram.

Referring now to FIGS. 1–6, a vibrating feeder indicated generally at 11 includes a shallow feeding bowl 12 and drive means 13. The bowl has a generally circular trough 14 gradually rising from the bottom of the bowl at 15 to a head section generally designated as 16. The bottom of the trough is V-shaped so that small parts such as thin germanium or silicon crystals are gradually fed up the trough to the head section. As they proceed, they become strung out along the trough so that they are delivered in succession to the head section as indicated by the small wafers 18.

In this embodiment a separate head 19 is employed, for convenience of manufacture. The head has a straight V-shaped trough 21 forming a continuation of the preceding trough section.

In many cases it is found that a pair of wafers will adhere together in overlying relationship. In order to insure that only one wafer will be delivered at a time to the subsequent gaging apparatus, a portion of the trough at the head section has one side of the V cut short to form a narrow ledge allowing one, or possibly both, overlying parts to fall off to the bottom of the bowl. As specifically shown, the head 19 has an inclined face 22 to form one side of the V, and a plate 23 is attached at an angle to the bottom of head 19 and projects slightly outward from face 22 to form the short outer side of the V. This is shown most clearly in FIG. 5. Thus, the short outer side of the V forms a narrow ledge which is advantageously of approximately the thickness of the wafers to be gaged. As shown, the bottom plate 23 is attached with machine screws allowing initial adjustment. The outer wall of the trough immediately preceding head 19 may be cut away, as shown at 24, so that this also forms a ledge allowing overlying parts to fall off.

The feeder drive 13 is designed to vibrate the bowl up and down and through a very small angle so that the parts gradually move up the inclined trough. This type of feeder drive is well known and description of the detailed construction is unnecessary.

Head 19 is provided with small apertures 25 spaced along the feeding path to a detection aperture 27. In this particular embodiment a photoelectric detector is employed to detect the presence of a wafer at the end of the feeding path. As specifically shown, a photocell 28 (FIG. 3) is placed inside the head to receive light passing through the aperture 27. A beam of light from source 29 is reflected by mirror 30 to the aperture 27. Thus, when a wafer reaches aperture 27 it obstructs the light path and the photocell gives a corresponding response. While a photoelectric detector has been found satisfactory, other detection means may be employed if desired.

Apertures 25, preceding the detection point, are connected with a source of vacuum through tube 31. As will be explained hereinafter, when a wafer is detected at point 27 suction is applied to apertures 25 to hold wafers thereat from further feed. Accordingly, even though the vibrating feeder is continuously energized to feed parts up the trough, they are prevented from moving to detection point 27 by the applied suction. Tube 31 is shown above bowl 12 for clarity, but may conveniently be arranged to pass down through the bowl. A small aperture 34 (FIG. 3), opening to the atmosphere, has been found helpful to avoid dislodging parts adjacent the apertures 25 when suction is removed.

Figure 2:
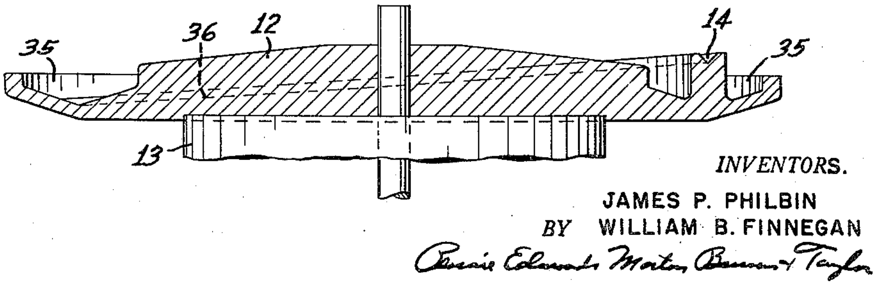
FIG. 2 is a cross-section of the feeding bowl taken along the line 2—2 of FIG. 1.

FIG. 2 is a cross-section showing the bowl in more detail. In the outer part of the bowl there is a shallow circumferential channel 35 into which parts may be dumped. The trough rises from the bottom of channel 35, as indicated by line 36. Although the diameter of the bowl and the rise of the trough may be selected as meets the requirements of a given application in one specific embodiment the bowl is approximately nine inches in diameter and the trough 14 rises to a final elevation of approximately ¾″.

Describing the overall feeding operation, a batch of small parts such as crystal wafers is deposited in channel 35 of the bowl, say in the region designated 32. It is not necessary to avoid placing parts in other portions of the bowl since they will move into channel 35 and be fed therearound until they start up the trough at 15. As the parts progress up the trough, they are gradually aligned in single file and are delivered in succession to the head section. Overlying parts may fall off in the region 24. If by chance they reach the apertures 25, when the inner piece is held against an aperture by suction, the vibration of the bowl insures that the outer overlying part will fall off into channel 35. The parts that have fallen off will continue around channel 35 until they reach the beginning of the trough at 15, whereupon they will be fed over again.

It has been found helpful to cut away a portion of the outer wall of the trough to form a ledge as indicated at 33, to eliminate any bunching of wafers on the way up the trough and promote feeding in single file on the inner wall.

As a wafer reaches the detection point 27, continued feed moves it to the top of chute 41, and thence to the gaging portion of the apparatus. A stationary platform 42 has a rotatable apertured transfer mask 43 closely spaced thereover, the spacing being selected to be less than the thickness of the wafers to be gaged so that, as the mask rotates, a wafer in an aperture thereof is moved along the platform. The mask is intermittently rotated or indexed by a Geneva movement hereafter described. As shown, the mask contains four tear-shaped apertures 44 evenly spaced circumferentially so that, when the mask is not moving, one aperture is always in position to receive a wafer from chute 41.

The receiving area of the platform is provided with a number of apertures 45 (FIG. 3) to which suction is applied. Thus, as a wafer slides down the chute to the receiving area, the suction prevents it from bouncing out of the aperture. Also, the suction removes fine particles which may be present on the wafers, and prevents any accumulation of dust, etc.

After a wafer reaches the receiving area, mask 43 rotates approximately 90° to deliver it to a gaging point 46. The aperture is designed with a narrow trailing edge, so that as the mask rotates the wafer lodges in the trailing edge and is accurately positioned at the gaging point, as illustrated in FIG. 3. A suction aperture 47 (FIG. 6) is provided at the gaging point to hold the wafer against the platform during the gaging operation. Advantageously additional suction apertures 48 are provided along the line of travel of the wafers to produce a slight drag on the wafer which insures that it will lodge at the trailing end of the aperture. The suction also removes any dust, particles, etc. which may be present.

A gage head 51 is mounted on the base 52 of the apparatus and has a retractable gage tip 53 for contacting a wafer at the gaging position. Gage tip 53 is retracted during movement of mask 43, and timing means are provided to move the tip downward at the proper time for gaging.

It is desirable to have the walls of apertures 44 sufficiently high to minimize bouncing of parts out of the aperture during the initial feed. However, the gage head 51 must be capable of very accurate measurement. To avoid excessive retraction of the gage tip, the mask 43 is provided with circular channels 54 connecting the apertures.

During the actual gaging of the wafer thickness, it is desirable for the wafer to be out of contact with the walls of the aperture, so as to avoid affecting the accuracy of the measurement. Accordingly, after the mask has moved a wafer to gaging position, the mask is backed off slightly as shown in FIG. 3. The suction at the gaging point not only holds the wafer during gaging, but also tends to flatten the wafer against the platform at the gaging point so as to enable its thickness to be gaged more accurately. The platform has a precision flat surface to promote accurate gaging. Advantageously the gage tip is of small diameter and convex, as shown in FIG. 6, so that it contacts the central portion of the wafer.

After the wafer has been gaged, the mask is rotated another 90° so that a given aperture reaches a discharge position. A chute 55 is provided to deliver the gaged wafer to a segregator generally indicated at 56. Platform 42 is cut away to allow a gaged wafer to drop into chute 55.

The application of suction to the apertures in head 19 is timed with the intermittent rotation of mask 43 so that, when a crystal has been gaged, the suction in head 19 is removed to allow another wafer to be fed to the detection point 27. This wafer slides down inlet chute 41 through the next aperture of the mask, so that as the mask rotates to deliver a gaged wafer to the outlet chute 55, a succeeding wafer is delivered to the gaging point 46. Thus, a continuous movement of wafers from the vibrating feeder to the gaging unit and thence to the segregator is obtained.

With three aperture positions, namely, receiving, gaging and discharge, it would be possible to employ three equally spaced apertures for this continuous operation. Four are shown in the embodiment of FIG. 1, since this number permits a simple Geneva movement to be employed for the intermittent mask rotation. A larger number could of course be employed if desired.

The segregator may take different forms as meets the requirements of a given application. As shown, a platform 61 carrying a number of receptacles 62 is arranged for rotation about axis 63 by suitable servo drive means (not shown). The gage head 51 is connected to a suitable gaging and classifying unit to obtain outputs corresponding to the size range into which a gaged part falls. For example the gaging and classifying apparatus described in application Serial No. 674,876, filed July 29, 1957, by Torn and Philbin for "Gaging Apparatus" may be employed. These outputs are then employed to control rotation of segregator 56 so as to position the proper receptacle under outlet chute 55 to receive the part gaged.

Different forms of servo drives suitable for the segregator are known in the art, and need not be specifically described. For example, a commutator may have segments connected to respective classifier outputs, and a motor energized to rotate platform 61 until the segment connected to the then-effective output is reached. Or detents actuated by the outputs may be used to stop the platform in the proper positions.

FIG. 4 is a detail showing the poriton of head 19 containing the aperture 27 through which light may pass to photoelectric cell 28. As shown, a wafer 18′ is over the aperture so as to intercept the light and produce a corresponding signal.

FIG. 5 is a detail showing one of the apertures 25 connected with suction line 31. A wafer 18 is shown over the aperture, so that it is held from moving when suction is applied.

Referring now to FIG. 7, driving and timing means are shown schematically. Motor 71 is connected through a magnetic clutch 72 to a drive shaft 73. Thus, the motor can be continuously energized and rotation of the drive shaft controlled by actuation of the clutch. A cam timing unit 74 is mounted on shaft 73 and may contain suitably shaped cams and switches actuated thereby for performing the desired timing functions as described hereinafter. Shaft 73 is connected through a suitable right angle gear drive to shaft 75 on which a Geneva driver 76, 76′ is fixed. The Geneva driver drives a Geneva wheel 77 fixed to shaft 78, and mask 43 is attached to the upper end of shaft 78.

Another cam 81 is fixed on shaft 75 and actuates a bell crank comprising a member 82 pivoted at 83, and an arm 84 having a cam follower 85 mounted thereon. Arm 84 is advantageously threaded into member 82 to provide for adjustment. A compression spring 86 urges the cam follower 85 into engagement with cam 81.

A rod 87 bears against one end of bell crank member 82, and the upper end thereof bears against a small plate 88 attached to the gage tip 53. A compression spring 89 has its lower end attached to rod 87 so as to urge the rod against member 82. By suitably shaping cam 81, rod 87 may be raised and lowered at the proper points during the gaging cycle so as to retract and advance gage tip 53.

Tube 91 is connected to a chamber 92 leading to the suction apertures 45 at the platform receiving area (FIG. 3), and also to the suction aperture 47 at the gaging point and intermediate suction apertures 48. Tube 91 is connected to a suitable suction source (not shown). Suction is advantageously continuously applied through tube 91 so that it is at all times effective to remove dust, etc. from the platform 42, and ready to hold wafers against the platform as they are received.

Bearings are provided for the various elements, but are not shown in the interests of simplicity of illustration.

FIG. 8 shows the Geneva movement used for intermittently rotating the mask. The driver is made in two pieces 76, 76′ which are secured to each other in proper relationship. A roller 93 is mounted on the lower member 76 and moves into and out of slots 94 machined in the bottom of wheel 77. As the driver 76 makes one revolution, it moves into and out of one of slots 94 to rotate wheel 77 approximately 90°.

As mentioned above, it is desirable to arrange the movement so that the mask 43 backs off slightly after it has delivered a wafer to the gaging point. To accomplish this, pin 93 and slots 94 are arranged for a movement slightly greater than 90°, and member 76′ is provided with a curved surface 95 which engages the adjacent point of the wheel 77 as the roller 93 moves out of slot 94 and nudges wheel 77 slightly backwards.

Referring now to FIGS. 9 and 10, block and timing diagrams of a suitable control arrangement are illustrated.

In FIG. 9 photocell 28 is shown connected to a relay actuating coil 95 and contact 96 of the relay switch. The switch arm 97 is shown grounded. Coil 95 is connected to a suitable voltage supply denoted +V. With the relay arm in the dotted position, an energizing circuit is completed through coil 95 and photocell 28. The cell is assumed to be of the type having a relatively low resistance in the presence of light and a substantially higher resistance in the absence of light.

When a crystal wafer intercepts the light beam, the current in relay coil 95 decreases and relay arm 97 moves to the upper position shown. This is the beginning of the measuring cycle shown in FIG. 10. The upper relay contact 96′ is connected to a vacuum head control 98, such as a solenoid-operated valve, so as to apply suction to the apertures 25 (FIG. 1) and prevent further feed of crystals. This is illustrated at point 111 in the timing diagram.

Contact 96′ is also connected to the magnetic clutch 72 to engage the clutch. Accordingly motor 71 drives the cam controls 74, denoted "Cam 1 Control" etc. Shortly after the beginning of rotation, cam 3 establishes a circuit through line 99 to the vacuum head control 98 which keeps the vacuum on until nearly the end of the gaging cycle, as shown by line 112 in the timing diagram. Also, cam 3 establishes a circuit through line 101 to the magnetic clutch 72 which continues energization thereof until nearly the end of the cycle.

The period during which cam 3 maintains energization of the vacuum head control and magnetic clutch is shown by line 113 in the timing diagram. It will be noted that vacuum continues thereafter for a slight interval, due to delay in the vacuum head control. Also the cycle continues for a slight interval, due to coasting of the shaft 73 and associated members (FIG. 7). Friction may be provided by the cams to avoid excessive coasting, or a positive detent provided if desired.

From the previous description, when the motor 71 rotates the cam shaft 73 it also rotates the mask 43 through the Geneva movement. As shown in FIG. 10, the movement of the mask starts at approximately point 114 and rotates through approximately 90° to point 115, and then backs off as indicated by line 116. This delivers the detected crystal to the gaging position. Cam 81 (FIG. 7) accordingly functions to move the gage tip down into gaging position as shown by line 118, 118′. Line 118′ has less slope than 118, so that as the gage tip touches the crystal wafer it will be advancing slowly and will not fracture the crystal. When the gaging has taken place, the gage tip is retracted as shown at 119.

Cam 1 functions primarily to control the operation of the gaging unit and classifier 102. As shown in the timing diagram, after the gage tip is moved into operating position, cam 1 functions to unlock the gage unit so that it gages the thickness of the crystal and establishes the proper output circuit during the interval 121. At the same time, cam 1 establishes a circuit through line 103 to the top of photocell 28. Line 103 is grounded internally of the cam 1 control unit, thereby reestablishing an energizing circuit through the photocell and relay coil 95. At this time there is no crystal wafer in the detecting position, since the wafers have been held from movement by the continuing vacuum in head 19. Accordingly, relay switch arm 97 moves to its lower (dotted) position, thereby breaking its contact with 96′. The vacuum continues to be applied and the magnetic clutch energized through cam 3 as already described.

Shortly after the gage unit is put in gaging condition, cam 2 control operates through line 104 to reset the segregator control unit 105 as shown at 122 in the timing diagram, and allow the movement of the segregator to start under the control of the new output from the classifier. With an electronic gaging and classifying unit, the proper classification circuit is rapidly established and a signal delivered through one of lines 106 from the gage unit 102 to the segregator control unit. Accordingly, the segregator control unit rotates the platform 61 (FIG. 1) until the proper receptacle is under trough 55. If the speed of operation of the segregator servo drive is sufficiently fast, its movement may be completed in the interval represented by 122. Otherwise, the signals through lines 106 continue to be applied to the segregator control unit during the lock-up interval represented by lines 123 in the timing diagram. The segregator control unit may be designed to continue its movement until the segregator has reached its proper position. The position should be reached prior to the movement of the mask on the next cycle, since that movement delivers a gaged crystal to the proper receptacle.

The specific embodiment described has many features which promote the rapid and precise feeding and gaging of small parts. Many modifications may be made within the spirit and scope of the invention, and selected features employed and others omitted as meets the requirements of a particular application. In some applications it may be desired to feed small parts one at a time for purposes other than gaging a dimension thereof, for example, measurement of other parameters of parts, segregation according to factors other than thickness, automatic assembly of miniature parts, etc. In such cases the vibratory feeder with part detection and suction holding may be employed to deliver parts one at a time to a receiving position. If desired, the receiving position may be an area of a platform and means such as that described employed for moving a part from the receiving area to a predetermined position therealong.

We claim:

1. Apparatus for gaging small parts which comprises a vibrating feeder for receiving small parts, said feeder having a trough for feeding said parts in succession to a head section thereof, detection means for detecting a part at a predetermined point along said head section, apertures in said head section spaced along the feeding path to the detection point, suction means responsive to said detection means for producing suction at said apertures to hold parts thereat from further feed, means for feeding a detected part to a stationary platform, intermittent moving means for moving a part along said platform to a gaging point, gaging means positioned to gage a part at said gaging point, and timing means for controlling said suction means and intermittent moving means to remove said suction after the gaging of a part and move a succeeding detected part to said gaging point.

2. Apparatus for gaging small parts which comprises a vibrating feeder for receiving small parts, said feeder having a trough for feeding said parts in succession to a head section thereof, detection means for detecting a part at a predetermined point along said head section, apertures in said head section spaced along the feeding path to the detection point, suction means responsive to said detection means for producing suction at said apertures to hold parts thereat from further feed, means for feeding a detected part to a stationary platform, intermittent moving means for moving a part along said platform to a gaging point, a suction aperture in said platform at said gaging point for holding a part during gaging, gaging means positioned to gage a part at said gaging point, and timing means for controlling said suction means and intermittent moving means to remove suction from said head section after the gaging of a part and move a succeeding detected part to said gaging point.

3. Apparatus for gaging small parts which comprises a vibrating feeder for receiving small parts, said feeder having a trough for feeding said parts in succession to a head section thereof, detection means for detecting a part at a predetermined point along said head section, apertures in said head section spaced along the feeding path to the detection point, suction means responsive to said detection means for producing suction at said apertures to hold parts thereat from further feed, a stationary platform and moving means closely spaced thereover, means for feeding a detected part to a receiving area of said platform, means for intermittently actuating said moving means to move a part along the platform to a gaging point, suction apertures in said platform at said receiving area and gaging point, gaging means positioned to gage a part at said gaging point, and timing means responsive to said detection means for controlling said suction means and intermittent actuating means to remove suction from said head section after the gaging of a part and move a succeeding detected part to said gaging point.

4. Apparatus for gaging small parts which comprises a vibrating feeder for receiving small parts, said feeder having a trough for feeding said parts in succession to a head section thereof, detection means for detecting a part at a predetermined point along said head section, apertures in said head section spaced along the feeding path to the detection point, suction means responsive to said detection means for producing suction at said apertures to hold parts thereat from further feed, a stationary platform and moving means closely spaced thereover, means for feeding a detected part to a receiving area of said platform, means for intermittently actuating said moving means to move a part along the platform to a gaging point and backing away therefrom prior to the gaging thereof, a suction aperture in said platform at said gaging point for holding a part during gaging, gaging means positioned to gage a part at said gaging point, and timing means responsive to said detection means for controlling said suction means and intermittent actuating means to remove suction from said head section after the gaging of a part and move a succeeding detected part to said gaging point.

5. Apparatus for gaging small parts which comprises a vibrating feeder for receiving small parts, said feeder having a trough for feeding said parts in succession to a head section thereof, detection means for detecting a part at a predetermined point along said head section, apertures in said head section spaced along the feeding path to the detection point, suction means responsive to said detection means for producing suction at said apertures to hold parts thereat from further feed, a stationary platform and moving means closely spaced thereover, means for feeding a detected part to a receiving area of said platform, means for intermittently actuating said moving means to move a part along the platform to a gaging point and backing away therefrom prior to the gaging thereof, suction apertures in said platform at said receiving area and gaging point, gaging means having a retractable gage tip for contacting a part at said gaging point, and timing means responsive to said detection means for controlling said suction means and intermittent actuating means to remove suction from said head section after the gaging of a part and move a succeeding detected part to said gaging point, said timing means retracting said gage tip during movement of a part to the gaging point.

6. Apparatus for gaging small parts which comprises a vibrating feeder for receiving small parts, said feeder having a trough for feeding said parts in succession to a head section thereof, at least a portion of said trough at said head section being V-shaped with one side short to form a narrow ledge allowing at least one of overlying parts to fall off, detection means for detecting a part at a predetermined point along said head section, apertures in said head section spaced along the feeding path to the detection point, suction means responsive to said detection means for producing suction at said apertures to hold parts thereat from further feed, means for feeding a detected part to a stationary platform, intermittent moving means for moving a part along said platform to a gaging point, gaging means positioned to gage a part at said gaging point, and timing means for controlling said suction means and intermittent moving means to remove said suction after the gaging of a part and move a succeeding detected part to said gaging point.

7. Apparatus for gaging small parts which comprises a vibrating feeder having a shallow bowl for receiving small parts, said bowl having a generally circular trough gradually rising from the bottom of the bowl to a head section for feeding said parts in succession to the head section, at least a portion of said trough at said head section being V-shaped with one side short to form a narrow ledge allowing at least one of overlying parts to fall off to the bottom of the bowl and be fed therearound to the beginning of the trough, detection means for detecting a part at a predetermined point along said head section, apertures in said head section spaced along the feeding path to the detection point, suction means responsive to said detection means for producing suction at said apertures to hold parts thereat from further feed, a stationary platform and moving means closely spaced thereover, a chute mounted on said bowl adjacent said detection point for delivering a detected part to a receiving area of said platform, means for intermittently actuating said moving means to move a part along the platform to a gaging point, suction apertures in said platform at said receiving area and gaging point, gaging means positioned to gage a part at said gaging point, and timing means responsive to said detection means for controlling said suction means and intermittent actuating means to remove suction from said head section after the gaging of a part and move a succeeding detected part to said gaging point.

8. Apparatus for gaging small parts which comprises a vibrating feeder for receiving small parts, said feeder having a trough for feeding said parts in succession to a head section thereof, detection means for detecting a part at a predetermined point along said head section, apertures in said head section spaced along the feeding path to the detection point, suction means responsive to said detection means for producing suction at said apertures to hold parts thereat from further feed, a platform and a rotatable apertured mask closely spaced thereover, means for feeding a detected part through a mask aperture to a receiving area of said platform, means for intermittently rotating said mask to move a part in said mask aperture to a gaging point along said platform, suction apertures in said platform at said receiving area and gaging point, gaging means positioned to gage a part at said gaging point, and timing means for controlling said suction means and intermittent rotating means to remove suction from said head section after the gaging of a part and move a succeeding detected part to said gaging point.

9. Apparatus for gaging small parts which comprises a vibrating feeder for receiving small parts, said feeder having a trough for feeding said parts in succession to a head section thereof, detection means for detecting a part at a predetermined point along said head section, apertures in said head section spaced along the feeding path to the detection point, suction means responsive to said detection means for producing suction at said apertures to hold parts thereat from further feed, a platform and a rotatable apertured mask closely spaced thereover, means for feeding a detected part through a mask aperture to a receiving area of said platform, means for intermittently rotating said mask to move a part in said mask aperture to a gaging point along said platform and backing away therefrom prior to the gaging thereof, suction apertures in said platform at said receiving area and gaging point and along the path of travel therebetween, gaging means having a retractable convex gage tip for contacting a part at said gaging point, and timing means responsive to said detection means for controlling said suction means and intermittent rotating means to remove suction from said head section after the gaging of a part and move a succeeding detected part to said gaging point, said timing means retracting said gage tip during movement of a part to the gaging point.

10. Apparatus for gaging small parts which comprises a vibrating feeder for receiving small parts, said feeder having a trough for feeding said parts in succession to a head section thereof, detection means for detecting a part at a predetermined point along said head section, apertures in said head section spaced along the feeding path to the detection point, suction means responsive to said detection means for producing suction at said apertures to hold parts thereat from further feed, means for feeding a detected part to a platform, intermittent moving means for moving a part on said platform to a gaging point, a suction aperture in said platform at said gaging point for holding a part during gaging, gaging and classifying means for producing outputs corresponding to different size ranges of parts gaged, said gaging means having a retractable gage tip for contacting a part at said gaging point, a segregator responsive to said outputs for segregating parts of different size range, means for delivering gaged parts to the segregator, and timing means responsive to said detection means for controlling said suction means and intermittent moving means to remove suction from said head section after the gaging of a part and move a succeeding detected part to said gaging point, said timing means retracting said gage tip during movement of a part to the gaging point.

11. Apparatus for gaging small parts which comprises a vibrating feeder for receiving small parts, said feeder having a trough for feeding said parts in succession to a head section thereof, detection means for detecting a part at a predetermined point along said head section, apertures in said head section spaced along the feeding path to the detection point, suction means responsive to said detection means for producing suction at said apertures to hold parts thereat from further feed, a platform and a rotatable mask closely spaced thereover, said mask having at least three circumferentially spaced apertures arranged for cyclical movement through receiving, gaging and discharge positions, means for intermittently rotating said mask from one position to the next to move parts in said apertures through corresponding positions, means for feeding a detected part through a mask aperture to a receiving area of said platform, suction apertures in said platform at said receiving and gaging positions, gaging and classifying means for producing outputs corresponding to different size ranges of parts gaged, said gaging means having a retractable gage tip for contacting a part at said gaging position, a segregator responsive to said outputs for segregating parts of different size range, means at said discharge position for delivering parts to said segregator, and timing means responsive to said detection means for actuating said intermittent rotating means through successive positions and actuating said suction means to remove suction from said head section after the gaging of each part, said timing means retracting said gage tip during movement of said mask.

12. Apparatus for gaging small parts which comprises a vibrating feeder having a shallow bowl for receiving small parts, said bowl having a generally circular trough gradually rising from the bottom of the bowl to a head section for feeding said parts in succession to the head section, at least a portion of said trough at said head section being V-shaped with one side short to form a narrow ledge allowing at least one of overlying parts to fall off to the bottom of the bowl and be fed therearound to the beginning of the trough, detection means for detecting a part at a predetermined point along said head section, apertures in said head section spaced along the feeding path to the detection point, suction means responsive to said detection means for producing suction at said apertures to hold parts thereat from further feed, a platform and a rotatable mask closely spaced thereover, said mask having at least three circumferentially spaced apertures arranged for cyclical movement through receiving, gaging and discharge positions, said means slightly backing off said mask after each forward movement thereof, means for intermittently rotating said mask from one position to the next to move parts in said apertures through corresponding positions, a chute mounted on said bowl adjacent said detection point for delivering a detected part to said platform through an aperture in the receiving position, suction apertures in said platform at said receiving and gaging positions and along the path of travel therebetween, gaging and classifying means for producing outputs corresponding to different size ranges of parts gaged, said gaging means having a retractable gage tip for contacting a part at said gaging position, a segregator responsive to said outputs for segregating parts of different size range, a chute at said discharge position for delivering parts to said segregator, and timing means responsive to said detection means for actuating said intermittent rotating means through successive positions and actuating said suction means to remove suction from said head section after the gaging of each part, said timing means retracting said gage tip during movement of said mask.

13. Apparatus for feeding small parts which comprises a vibrating feeder for receiving small parts, said feeder having a trough for feeding said parts in succession to a head section affixed thereto, detection means for detecting a part at a predetermined point along said head section, apertures in said head section spaced along the feeding path to the detection point, suction means responsive to said detection means for producing suction at said apertures to hold succeeding parts thereagainst and prevent further feed thereof, means for feeding a detected part to a receiving position, and means for removing said suction to allow a succeeding part to move to said detection point.

14. Apparatus for feeding small parts which comprises a vibrating feeder for receiving small parts, said feeder having a trough for feeding said parts in succession to a head section affixed thereto, detection means for detecting a part at a predetermined point along said head section, apertures in said head section spaced along the feeding path to the detection point, suction means responsive to said detection means for producing suction at said apertures to hold succeeding parts thereagainst and prevent further feed thereof, a stationary platform and moving means closely spaced thereover, means for feeding a detected part to a receiving area of said platform, means for intermittently actuating said moving means to move a part on said receiving area to a predetermined position along the platform, and means for removing said suction to allow a succeeding part to move to said detection point.

References Cited in the file of this patent

UNITED STATES PATENTS

| | | |
|---|---|---|
| 2,063,485 | Carris | Dec. 8, 1936 |
| 2,222,895 | Carris et al. | Nov. 26, 1940 |
| 2,316,375 | Van Haften | Apr. 13, 1943 |
| 2,764,800 | Harwood | Oct. 1, 1956 |
| 2,867,313 | Deshaw | Jan. 6, 1959 |

FOREIGN PATENTS

| | | |
|---|---|---|
| 916,277 | Germany | Aug. 5, 1954 |